United States Patent [19]
Robinson et al.

[11] Patent Number: 5,457,318
[45] Date of Patent: Oct. 10, 1995

[54] THERMAL DETECTOR APPARATUS AND METHOD USING REDUCED THERMAL CAPACITY

[75] Inventors: James E. Robinson, Dallas; James F. Belcher, Plano; Howard R. Beratan, Richardson; Steven N. Frank, McKinney; Charles M. Hanson, Richardson; Paul O. Johnson, Allen; Robert J. S. Kyle, Rowlett; Edward G. Meissner, Dallas; Robert A. Owen, Rowlett; Gail D. Shelton, Mesquite; William K. Walker, Plano, all of Tex.

[73] Assignee: Texas Instruments Incorporated, Dallas, Tex.

[21] Appl. No.: 235,413

[22] Filed: Apr. 29, 1994

[51] Int. Cl.⁶ ............................................ G01J 5/06
[52] U.S. Cl. ............................ 250/332; 250/338.3
[58] Field of Search .................... 250/332, 338.3, 250/338.2, 349, 370.08

[56] References Cited

U.S. PATENT DOCUMENTS

| | | |
|---|---|---|
| 3,846,820 | 11/1974 | Lampe et al. . |
| 4,018,608 | 4/1977 | Frazier . |
| 4,080,532 | 3/1978 | Hopper ............................ 250/332 |
| 4,142,207 | 2/1979 | McCormack et al. . |
| 4,143,269 | 3/1979 | McCormack et al. ............ 250/352 |
| 4,162,402 | 7/1979 | Hopper ............................ 250/332 |
| 4,205,227 | 5/1980 | Reed ............................... 250/330 |
| 4,275,302 | 6/1981 | Imbert et al. .................... 250/330 |
| 4,379,232 | 4/1983 | Hopper ............................ 250/332 |
| 4,379,971 | 4/1983 | Smith et al. ................. 250/338.3 X |
| 4,594,507 | 6/1986 | Elliott et al. .................... 250/331 |
| 4,595,832 | 6/1986 | LaDelfe et al. ............. 250/338.3 X |
| 4,705,361 | 11/1987 | Frazier et al. . |
| 4,740,700 | 4/1988 | Shaham et al. ............. 250/338.3 X |
| 4,751,387 | 6/1988 | Robillard ........................ 250/331 |
| 4,894,544 | 1/1990 | Turnbull ..................... 250/332 X |
| 4,927,771 | 5/1990 | Ferrett ....................... 250/332 X |
| 4,994,672 | 2/1991 | Cross et al. ..................... 250/330 |
| 5,008,541 | 4/1991 | Audaire et al. ............. 250/332 X |
| 5,010,251 | 4/1991 | Grinberg et al. ............... 250/332 |
| 5,021,663 | 6/1991 | Hornbeck ....................... 250/349 |
| 5,047,644 | 9/1991 | Meissner et al. ................ 250/332 |
| 5,051,591 | 9/1991 | Trotta et al. .................... 250/351 |
| 5,196,703 | 3/1993 | Keenan ........................... 250/332 |
| 5,238,530 | 8/1993 | Douglas et al. ................. 156/635 |
| 5,264,326 | 11/1993 | Meissner et al. ............... 430/313 |

FOREIGN PATENT DOCUMENTS

| | | |
|---|---|---|
| 939943 | 1/1974 | Canada . |
| 197806 | 11/1976 | Germany ................ H01L 31/06 |
| 2251952 | 7/1992 | United Kingdom . |
| WO91/16607 | 10/1991 | WIPO . |

*Primary Examiner*—Constantine Hannaher
*Assistant Examiner*—Edward J. Glick
*Attorney, Agent, or Firm*—Bret J. Petersen; James C. Kesterson; Richard L. Donaldson

[57] ABSTRACT

A thermal detection system (10) includes a focal plane array (12), a thermal isolation structure (14), and an integrated circuit substrate (16). Focal plane array (12) includes thermal sensors (28), each having an associated thermal sensitive element (30). Thermal sensitive element (30) is coupled with one side to infrared absorber and common electrode assembly (36) and on the opposite side to an associated contact pad (20) disposed on the integrated circuit substrate (16). Reticulation kerfs (52a, 52b) separate adjacent thermal sensitive elements (30a, 30b, 30c) by a distance at least half the average width (44, 46) of a single thermal sensitive element (30a, 30b, 30c). A continuous, non-reticulated optical coating (38) may be disposed over thermal sensitive elements (30a, 30b, 30c) to maximize absorption of thermal radiation incident to focal plane array (12).

11 Claims, 2 Drawing Sheets

5,457,318

THERMAL DETECTOR APPARATUS AND METHOD USING REDUCED THERMAL CAPACITY

TECHNICAL FIELD OF THE INVENTION

This invention relates to thermal (infrared) detectors, and more particularly to a thermal detector apparatus and method using reduced thermal capacity.

RELATED APPLICATIONS

This application is related to copending application Ser. No. 08/182,865, entitled *Infrared Detector and Method*, Attorney's Docket TI-18788, and copending application Ser. No. 08/82,268, entitled *Infrared Detector and Method*, Attorney's Docket TI-17233, both applications of the same assignee.

BACKGROUND OF THE INVENTION

One common application for thermal sensors is in thermal (infrared) detection devices such as night vision equipment. One class of thermal detection devices includes a focal plane array of infrared detector elements or thermal sensors coupled with an integrated circuit substrate with a corresponding array of contact pads between the focal plane array and the integrated circuit substrate. The thermal sensors define the respective picture elements or pixels of the resulting thermal image.

In one embodiment, the thermal sensor includes a thermal sensitive element formed from a pyroelectric material that changes its electrical polarization and capacitance in response to thermal radiation, such as barium strontium titanate (BST). An infrared absorber and common electrode assembly is disposed on one side of the thermal sensitive element and comprises an optical coating overlaying a common electrode. A sensor signal electrode is disposed on the opposite side of each thermal sensitive element. The infrared absorber and common electrode assembly typically extends across the surface of the focal plane array and electrically couples each thermal sensitive element through the common electrode. Each infrared detector element or thermal sensor is defined, in part, by a portion of the infrared absorber and common electrode assembly and a respective sensor signal electrode, which constitute capacitive plates, and a thermal sensitive element, which constitutes a dielectric or insulator disposed between the capacitive plates.

A reduction in the thermal capacity of the thermal sensitive element may extend the performance limits of the associated thermal sensor. For a given value of thermal isolation between the thermal sensor and its environment, a reduction in the thermal capacity of the thermal sensitive element increases the temperature response of the thermal sensor to a given radiant flux. Several approaches use thinner thermal sensitive elements with reduced thermal capacity to improve the performance of a thermal detector.

SUMMARY OF THE INVENTION

In accordance with the present invention, the disadvantages and problems associated with reducing the thermal capacity of a thermal sensor in a focal plane array have been substantially reduced or eliminated. The present invention reduces thermal capacity by reducing the physical area of the detector pixel. In particular, the present invention widens the reticulation kerf between adjacent thermal sensitive elements to reduce thermal capacity and improve performance of the thermal detector.

In accordance with one aspect of the present invention a thermal detector includes a focal plane array and an integrated circuit substrate. Thermal sensors provide a sensor signal output representative of the amount of thermal radiation incident to the focal plane array. The thermal sensors include thermal sensitive elements spatially separated by reticulation kerfs. Each reticulation kerf separates adjacent thermal sensitive elements by a distance at least half the average width of a single thermal sensitive element. An infrared absorber and common electrode assembly is coupled with one side of the thermal sensitive elements. Sensor signal electrodes are coupled with the other side of the thermal sensitive elements. Signal contact pads, disposed on the integrated circuit substrate and coupled with the sensor signal electrodes, receive the sensor signal output from the thermal sensors. A thermal isolation structure projects from the integrated circuit substrate adjacent to the signal contact pads and mounts the focal plane array on the integrated circuit substrate.

In another aspect of the present invention, a method is disclosed for fabricating a focal plane array with thermal sensors that provide a sensor signal output representative of the amount of thermal radiation incident to the focal plane array. A common electrode for supplying a voltage to the thermal sensors is formed. A pyroelectric material may be used to form thermal sensitive elements coupled on one side with the common electrode. A masking material may be formed over the pyroelectric material and patterned. The pyroelectric material is removed to form thermal sensitive elements spatially separated by reticulation kerfs. Each reticulation kerf separates adjacent thermal sensitive elements by a distance at least half the average width of a single thermal sensitive element.

Important technical advantages of the present invention can include reducing the thermal capacity of a thermal sensor by widening the spacing or reticulation kerf intermediate adjacent thermal sensitive elements. Alone or in combination with previous approaches of thinning the pyroelectric material used to form the thermal sensors, the present invention widens the reticulation kerf between adjacent thermal sensitive elements. In one embodiment, the reticulation kerf separates adjacent thermal sensitive elements by a distance at least half the average width of a single thermal sensitive element. A widened reticulation kerf reduces thermal capacity of the thermal sensor, which improves the temperature response of the thermal detector to a given thermal radiation.

Other important technical advantages of the present invention can include providing a continuous, non-reticulated optical coating that bridges the reticulation kerf between adjacent thermal sensitive elements to maximize absorption of incoming thermal radiation despite the reduced size of the thermal sensitive elements. An optical coating that spans the entire area of the focal plane array absorbs maximum thermal radiation and transfers thermal energy to the underlying thermal sensitive elements irrespective of the spacing between the thermal sensitive elements.

Other important technical advantages of the present invention can include improving inter-pixel thermal isolation by widening the reticulation kerf between adjacent thermal sensitive elements. Crosstalk or thermal coupling may occur between adjacent thermal sensors due to the infrared absorber and common electrode assembly coupled with the thermal sensitive elements. The present invention improves inter-pixel thermal isolation by widening the reticulation kerf between adjacent thermal sensitive elements.

BRIEF DESCRIPTION OF THE DRAWINGS

For a more complete understanding of the present invention, and for further features and advantages, reference is now made to the following description taken in conjunction with the accompanying drawings, in which.

DETAILED DESCRIPTION OF THE INVENTION

Figure 1:
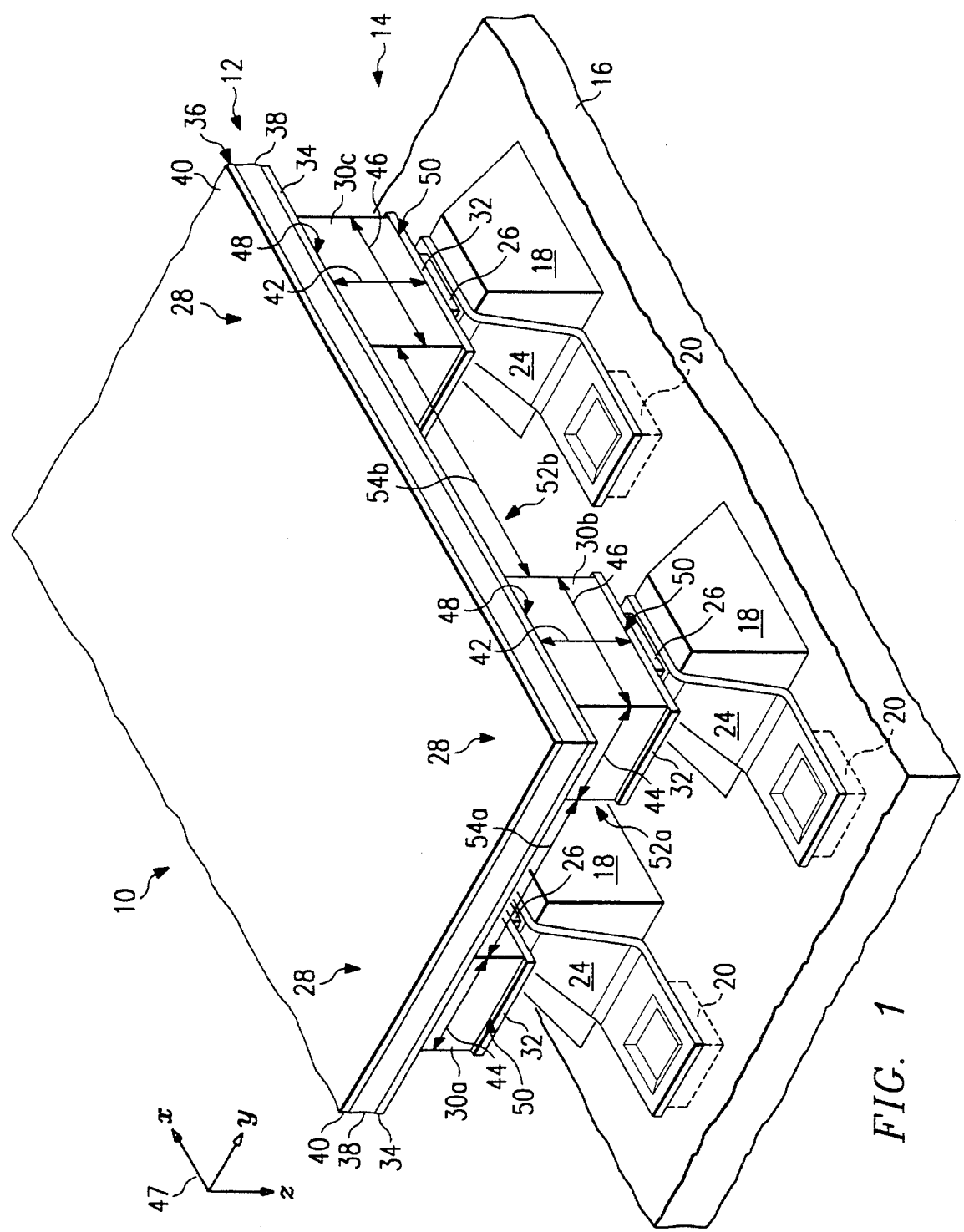
FIG. 1 is an isometric drawing showing a portion of a thermal detection system with a focal plane array having a plurality of thermal sensitive elements separated by reticulation kerfs spanning a distance at least half the average width of the thermal sensitive elements.
Figure 2:
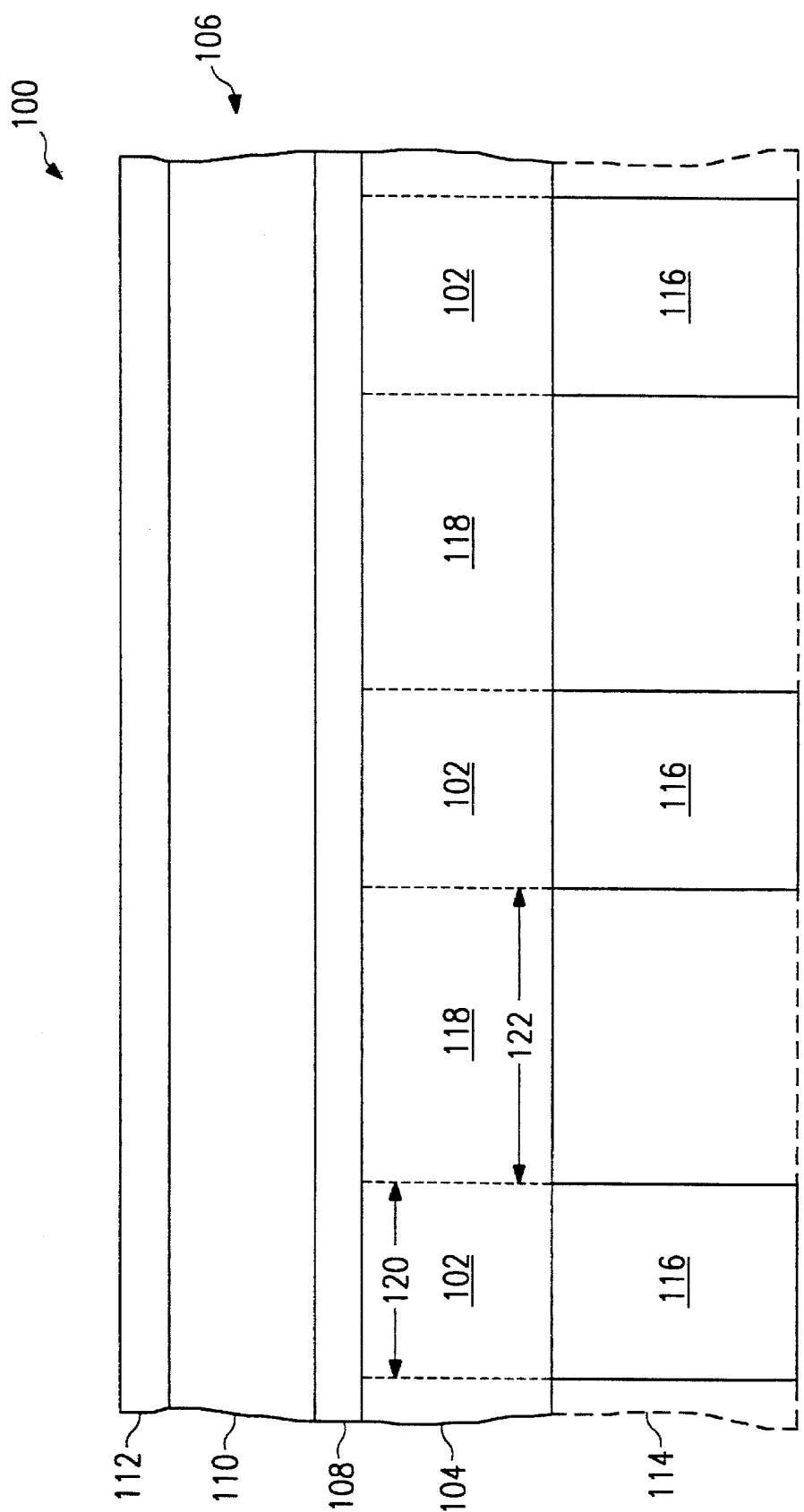
FIG. 2 is a cross section of a portion of the focal plane array during fabrication where thermal sensitive elements are formed from a continuous slab of pyroelectric material, such as barium strontium titanate (BST).

The present invention and its advantages are best understood by referring to FIGS. 1 and 2 of the drawings, like numerals being used for like and corresponding parts of the various drawings.

Infrared detectors are typically based upon either the generation of a change in voltage or current due to a change in temperature resulting from incident infrared radiation striking the detector or the generation of a change in voltage or current due to a photon-electron interaction within the material used to form the detector. This latter effect is sometimes called the internal photo-electric effect, and detectors using this phenomenon are called photon detectors. Detectors that make use of temperature dependent properties are called thermal detectors. Some thermal detectors are based upon the change in resistance or capacitance of a thin conductor caused by the heating effect of incident infrared radiation. Such thermal detectors are sometimes referred to as bolometers.

Thermal detection system 10, which will be described later in more detail, functions based upon the generation of a change in voltage or current due to a change in temperature of a pyroelectric material resulting from incident infrared radiation. However, the present invention may be used with other types of thermal detectors including bolometers.

Some previous thermal detectors have attempted to improve the net responsiveness of the associated thermal sensors by using a thinner thermal sensitive element. For a given value of thermal isolation between the thermal sensor and its surrounding environment, a thinner thermal sensitive element with reduced thermal capacity will increase the temperature response to a given radiant flux. However, thinning the thermal sensitive element also reduces the voltage responsiveness, which varies linearly with thickness, and increases electrical capacitance, which varies inversely with thickness. The reduction in voltage responsiveness offsets the increase in temperature response, provided the thermal isolation is sufficient. The increase in electrical capacitance increases the net responsiveness of the thermal sensor by reducing a loss due to parasitic capacitance in the processing circuitry. A thinner thermal sensitive element introduces less dielectric-loss noise, and less temperature-fluctuation noise. The net result in previous thermal detectors using thinner thermal sensitive elements is no change in the total signal generated by the thermal sensor with a net decrease in the noise sources.

Some of the problems associated with previous thermal sensors included fabrication difficulties as the thermal sensitive elements became thinner and the reticulation kerf between the thermal sensitive elements became narrower. This inevitably led to fabrication limitations, in terms of the minimum width of the reticulation kerf, the packing density of the thermal sensors in the focal plane array, and the maximum level of inter-pixel thermal isolation that could be achieved with thinner thermal sensors.

The present invention provides a thermal sensor with reduced thermal capacity, and therefore improved overall responsiveness, and eliminates many of the problems associated with previous thermal sensors. Advantages of the present invention are realized by widening the reticulation kerf between adjacent thermal sensitive elements, alone or in combination with thinning the thermal sensitive element. A wide reticulation kerf improves thermal responsiveness of the thermal sensor by reducing thermal capacity, improves inter-pixel thermal isolation, and simplifies the fabrication process of a focal plane array.

One embodiment of the present invention is shown in connection with thermal detector or thermal detection system 10 of FIG. 1. Some of the principal components which comprise thermal detection system 10 include focal plane array 12, thermal isolation structure 14, and integrated circuit substrate 16. The various components of thermal detection system 10 are preferably contained in a housing (not shown) in a vacuum environment.

Thermal isolation structure 14 provides pixel-IC thermal isolation, electrical coupling between focal plane array 12 and integrated circuit substrate 16, and structural support for mounting focal plane array 12 on integrated circuit substrate 16. Thermal isolation structure 14 comprises mesa-type formations 18 formed adjacent to contact pads 20 of integrated circuit substrate 16. Mesa-type formations 18 are formed from polyimide or other appropriate low thermal conductivity material. Each mesa-type formation 18 supports a corresponding mesa strip conductor 24, which electrically couples focal plane array 12 to a corresponding contact pad 20 disposed on integrated circuit substrate 16. Mesa strip conductor 24 may be formed from an interconnect metal, such as a titanium/tungsten alloy, that provides adequate electrical conductivity to couple focal plane array 12 to integrated circuit substrate 16.

Bump-bonding material 26 may be placed on mesa strip conductor 24 to facilitate bonding of thermal isolation structure 14 to focal plane array 12. Indium bump-bonding techniques have been satisfactorily used to form electrically conductive bonds between focal plane array 12 and thermal isolation structure 14. It should be understood that the present invention contemplates any thermal isolation structure 14 that provides pixel-IC thermal isolation, mechanical integrity during the fabrication process, and adequate electrical coupling between integrated circuit substrate 16 and focal plane array 12.

Various types of semiconductor materials and integrated circuit substrates may be used with the present invention. U.S. Pat. No. 4,143,629, entitled "Ferroelectric Imaging System," issued to McCormack, et. al. and assigned to Texas Instruments Incorporated, provides information concerning thermal detectors fabricated from thermal sensitive elements and a silicon switching matrix or integrated circuit substrate. It should be understood that the present invention may be used with any appropriate substrate capable of receiving signals generated by focal plane array 12. U.S. Pat. No. 5,047,644, entitled "Polyimide Thermal Isolation Mesa for a Thermal Imaging System," issued to Meissner, et. al. and assigned to Texas Instruments Incorporated, discloses a thermal isolation structure having mesa-type formations formed from polyimide.

Focal plane array 12 comprises a plurality of thermal sensors 28. The quantity and configuration of thermal sensors 28 depends on the desired N by M pixel resolution of focal plane array 12. Thermal sensor 28 comprises thermal sensitive element 30 formed from a pyroelectric material that changes its electrical polarization and capacitance in response to thermal radiation, such as barium strontium titanate (BST). FIG. 1 illustrates three specific thermal sensitive elements 30a, 30b, 30c to describe certain aspects of the present invention, but reference numeral "30" will be used generally to designate any thermal sensitive element 30. Materials in the lead titanate family including lead titanate (PT), lead lanthanum titanate (PLT), lead zirconium titanate (PZT), and lead lanthanum zirconium titanate (PZLT) may also be used to form thermal sensitive element 30.

The pyroelectric transducer or capacitor associated with each thermal sensor 28 is defined in part by thermal sensitive element 30, sensor signal electrode 32, and common electrode 34 of infrared absorber and common electrode assembly 36. Therefore, thermal sensitive element 30 functions as a dielectric with respect to sensor signal electrode 32 and common electrode 34. Infrared absorber and common electrode assembly 36 also includes optical coating 38 and optionally thin outer layer 40.

In one embodiment, infrared absorber and common electrode assembly 36 is a multi-layer structure that forms a resonant optical cavity tuned to maximize absorption over the desired infrared spectrum. Common electrode 34 may be formed from an opaque, highly reflective material such as nichrome (NiCr) or any other appropriate material that can deliver a common voltage to thermal sensitive element 30. The common voltage may be a negative, positive, or zero potential. Optical coating 38 is an organic material, such as PARLENE, whose thickness is adjusted as appropriate for its refractive index to tune the cavity to maximize absorption over the desired spectrum. Thin outer layer 40 is a thin, semi-transparent metal whose thickness is adjusted to minimize the net amplitude of the electromagnetic wave reflected from the resonant cavity.

In one embodiment, optical coating 38 and optionally thin outer layer 40 are continuous, non-reticulated layers that bridge reticulation kerf 52a, 52b between adjacent thermal sensitive elements 30a, 30b, 30c, as shown in FIG. 1. A continuous, non-reticulated optical coating 38 absorbs the maximum thermal radiation incident to focal plane array 12 and transfers thermal energy to thermal sensitive elements 30a, 30b, 30c irrespective of the spacing between thermal sensitive elements 30a, 30b, 30c.

In operation, thermal detection system 10 produces a thermal image in response to incident infrared radiation striking focal plane array 12. Infrared absorber and common electrode assembly 36 absorbs infrared energy and transfers a temperature change to thermal sensitive element 30 of thermal sensor 28. The temperature change alters the electrical polarization and capacitance of thermal sensitive element 30 and produces a representative sensor signal appearing on sensor signal electrode 32. The total sensor signal output will depend upon the electrical polarization and capacitance of thermal sensitive element 30, which in turn is a function of the incident infrared radiation. Sensor signal electrode 32 is electrically coupled through mesa strip conductor 24 of thermal isolation structure 14 to a corresponding contact pad 20 on integrated circuit substrate 16.

In accordance with the present invention, the geometry of thermal sensitive element 30 of thermal sensor 28 is defined, in part, by height 42, first width 44, and second width 46. Referring to coordinate system 47, height 42 is measured along the z-axis, first width 44 along the y-axis, and second width 46 along the x-axis. For clarity, thermal sensitive element 30 is shown as a rectangular parallelpiped, but it should be understood that opposite faces of thermal sensitive element 30 need not be parallel. When opposite faces of thermal sensitive element 30 are not parallel, both first width 44 and second width 46 may be expressed as average widths. In addition, thermal sensitive element 30 may have more or less than the six faces shown in FIG. 1.

In one embodiment, the walls of thermal sensitive element 30 are substantially vertical and extend from first face 48 coupled with common electrode 34 to second face 50 coupled with sensor signal electrode 32. It should be understood that the present invention also contemplates thermal sensitive element 30 with walls extending from first face 48 to second face 50 that are in alternate configurations, such as bulged in the middle or sloped, due to the fabrication process of focal plane array 12 as described with reference to FIG. 2 below.

Reticulation kerf 52a separates thermal sensitive element 30a from thermal sensitive element 30b, and reticulation kerf 52b separates thermal sensitive element 30b from thermal sensitive element 30c. In the preferred embodiment of the present invention, reticulation kerf 52a has a reticulation kerf width 54a at least half as large as first width 44 of adjacent thermal sensitive elements 30a and 30b. Similarly, reticulation kerf 52b has a reticulation kerf width 54b at least half as large as second width 46 of adjacent thermal sensitive elements 30b and 30c.

It should be understood from the present invention that first width 44 and reticulation kerf width 54a are measured along the y-axis of coordinate system 47, and that second width 46 and reticulation kerf width 54b are measured along the x-axis of coordinate system 47. For purposes of describing the present invention, reticulation kerf width 54a is defined generally with respect to first width 44 of thermal sensitive elements 30a, 30b and reticulation kerf width 54b is defined generally with respect to second width 46 of thermal sensitive elements 30b, 30c. In the specific embodiment where first width 44 equals second width 46 and reticulation kerf width 54a equals reticulation kerf width 54b, the spacing and arrangement of thermal sensitive elements 30a, 30b, 30c is symmetric in the x-y plane of coordinate system 47.

As described above, thermal detection system 10 receives incident infrared radiation at focal plane array 12 and converts this radiation into thermal energy which causes a rise in temperature of thermal sensitive element 30. Given the time of exposure and intensity of the infrared radiation, thermal sensitive element 30 will rise to a certain temperature depending on two things. First, the rise in temperature of thermal sensitive element 30 depends on its thermal isolation from the surrounding environment, including pixel-IC thermal isolation from integrated circuit substrate 16 and inter-pixel thermal isolation from adjacent thermal sensors 28. Second, the temperature of thermal sensitive element 30 will rise depending on its thermal capacity. Therefore, given a fixed pixel-IC and inter-pixel thermal isolation, the thermal response of thermal sensor 28 may be improved by reducing the mass of thermal sensitive element 30.

Previous thermal detection systems have reduced the mass of thermal sensitive element 30 by reducing its height 42. The present invention, however, achieves improved thermal response by reducing a first width 44 to widen reticulation kerf 52a between thermal sensitive elements 30a and 30b, and by reducing a second width 46 to widen reticulation kerf 52b between thermal sensitive elements 30b and 30c. Thermal sensors 28 may be placed at a minimum distance or pitch from adjacent thermal sensors 28 when considering the fabrication density of the underlying thermal isolation structure 14 and integrated circuit substrate 16. Given a minimum pitch between adjacent thermal sensors 28, the present invention contemplates reducing thermal capacity of thermal sensitive elements 30 without sacrificing pixel resolution of thermal detector 10. In addition, optical coating 38 extends as a continuous, non-reticulated layer disposed over thermal sensitive elements 30 and therefore absorbs the maximum thermal radiation incident to focal plane array 12 irrespective of the size and arrangement of the underlying thermal sensitive elements 30.

Thermal sensor 28 exhibits a first order thermal response to incident thermal radiation on focal plane array 12. The thermal response time constant ($\tau$) is dependent on the thermal capacity (C) of thermal sensitive element 30 and the thermal resistance (R) between thermal sensor 28 and its surrounding environment. The governing equation $\tau = R \cdot C$ indicates that a reduction in thermal capacity (C) of thermal sensitive element 30 results in a lower thermal response time constant ($\tau$).

The thermal response time constant ($\tau$) may be increased by increased thermal resistance (R) through improved thermal isolation between adjacent thermal sensors 28 and underlying integrated circuit substrate 16. An appropriate choice of thermal response time constant ($\tau$) of thermal sensor 28 depends on the frequency and duty cycle of a chopper (not shown) that alternately exposes focal plane array 12 to thermal radiation. For example, a chopper with a fifty percent duty cycle capable of delivering thirty frames of thermal image data each second is open for one sixtieth of a second and closed for the next one sixtieth of a second. It is desirable that during the open interval, focal plane array 12 is exposed to and absorbs maximum infrared radiation, and that thermal sensor 28 responds appropriately to generate a maximum sensor signal. A short time constant may not allow thermal sensor 28 to produce a maximum voltage, in essence wasting potential signal. A long time constant may result in degraded responsiveness of thermal sensor 28. Therefore, a desirable choice of thermal response time constant ($\tau$) of thermal sensor 28 produces a consistent rise in temperature to a maximum level over the open interval of the chopper to allow for maximum sensor signal generation.

A wider reticulation kerf 52a, 52b between adjacent thermal sensitive elements 30 decreases the mass of thermal sensitive elements 30 which reduces thermal capacitance (C). Therefore, the present invention contemplates a compromise between reduced thermal capacitance (C) and increased thermal isolation (R) to produce a thermal sensor 28 with improved net responsiveness. This net responsiveness will necessarily depend on the chopper frequency and duty cycle.

The reduction in thermal capacity of thermal sensor 28 may also increase losses due to parasitic capacitance in the processing circuitry (not shown). Electrical capacitance is proportional to the area of the dielectric between capacitive plates and indirectly proportional to the thickness or distance between the plates. Previous methods of thinning the thermal sensitive element reduced thermal capacity of the thermal sensor, but also increased electrical capacitance. Increased electrical capacitance reduces losses due to parasitic capacitance since electrical capacitance of the thermal sensor increases with respect to parasitic capacitance in the processing circuitry. If parasitic capacitance of the processing circuitry is low and electrical capacitance of the thermal sensor is high, then the voltage measurement from the thermal sensor is comprised substantially of the signal due to incident thermal radiation. However, if the parasitic capacitance is relatively high in comparison to the electrical capacitance of the thermal sensor, then the processing circuitry will have difficulty reading the signal due to incident thermal radiation.

A wider reticulation kerf 52a, 52b between adjacent thermal sensitive elements 30 reduces electrical capacitance of thermal sensors 28. Assuming constant parasitic capacitance in the processing circuitry, this may result in increased losses due to parasitic capacitance. This loss may be overcome by re-designing the processing circuitry for thermal sensor 28 with a wider reticulation kerf 52a, 52b.

In addition to losses introduced by parasitic capacitance, a wider reticulation kerf 52a, 52b may also increase both the dielectric loss-noise and the temperature-fluctuation noise generated by thermal sensor 28. The dielectric-loss noise or "Johnson noise" relates to the resistive component of thermal sensor 28. The temperature-fluctuation noise relates to the random component in the rate of thermal transfer between thermal sensor 28 and its environment.

Thermal detection system 10 formed from thermal sensors 28 with widened reticulation kerfs 52a and 52b will result in a net improvement of signal-to-noise ratio (SNR), which varies inversely approximately as the square root of the pixel physical area. This result assumes relatively high pixel-IC thermal isolation between focal plane array 12 and integrated circuit 16 and relatively high inter-pixel thermal isolation between adjacent thermal sensors 28. In addition, an increase in SNR assumes relatively low losses due to parasitic capacitance of the processing circuitry. Assuming the above, the benefits of increased signal due to decreased thermal capacity of thermal sensors 28 outweighs the increased dielectric-loss noise and thermal-fluctuation noise for a net improved SNR.

FIG. 2 illustrates a cross section of a portion of focal plane array 100 during fabrication of thermal sensitive elements 102 from a continuous slab of pyroelectric material 104. Pyroelectric material 104 is preferably barium strontium titanate (BST), but may be any of the alternative materials described with reference to thermal sensitive element 30 of FIG. 1. Focal plane array 100 further comprises infrared absorber and common electrode assembly 106 disposed over and coupled with pyroelectric material 104. Infrared absorber and common electrode assembly 106 further comprises common electrode 108, optical coating 110, and thin outer layer 112. The structure and composition of infrared absorber and common electrode assembly 106 is similar to infrared absorber and common electrode assembly 36, described with reference to FIG. 1.

Thermal sensitive elements 102 are fashioned by removing pyroelectric material 104 to form reticulation kerfs 118. Reticulation kerfs 118 are disposed intermediate thermal sensitive elements 102. In the preferred embodiment, reticulation kerfs 118 have a reticulation kerf width 122 that is at least half the average width 120 of thermal sensitive elements 102.

Various methods may be used to remove portions of pyroelectric material 104 to form reticulation kerfs 118. In one embodiment, laser reticulation may be used to remove pyroelectric material 104 without the need of a mask. Laser reticulation to form reticulation kerfs 118 may be performed in a single pass or multiple passes, depending on the desired reticulation kerr width 122 and the particular laser implementation.

In another embodiment, pyroelectric material 104 may be removed using ion milling, plasma etching, chemical etching, or other appropriate process. In this embodiment, a layer of masking material 114 patterned into mask elements 116 is disposed over thermal sensitive elements 102. FIG. 2 illustrates focal plane array 100 after patterning masking material 114 and before removing pyroelectric material 104 to form reticulation kerfs 118. During processing, pyroelectric material 104 between masking elements 116 will be removed leaving reticulation kerfs 118. Masking material 114 may be an organic photoresist, a metal, or other appropriate masking material.

Although the present invention has been described with several embodiments, various changes and modifications may be suggested to one skilled in the art, and it is intended that the present invention encompass such changes and modifications as fall within the scope of the appended claims.

What is claimed is:

1. A thermal detector including a focal plane array and an integrated circuit substrate, comprising:
 a plurality of thermal sensors for providing a sensor signal output representative of the amount of thermal radiation incident to the focal plane array, the thermal sensors comprising a plurality of thermal sensitive elements spatially separated by a plurality of reticulation kerfs, each reticulation kerf separating adjacent thermal sensitive elements by a distance at least half the average width of a single thermal sensitive element;
 an infrared absorber and common electrode assembly coupled with one side of the thermal sensitive elements;
 a plurality of sensor signal electrodes coupled with the other side of the thermal sensitive elements;
 a plurality of signal contact pads, disposed on the integrated circuit substrate and coupled with the sensor signal electrodes, for receiving the sensor signal output from the thermal sensors; and
 a thermal isolation structure projecting from the integrated circuit substrate adjacent to the signal contact pads for mounting the focal plane array on the integrated circuit substrate.

2. The detector of claim 1, wherein the infrared absorber and common electrode assembly comprises a continuous, non-reticulated optical coating sensitive to infrared radiation.

3. The detector of claim 1, wherein each thermal sensitive element is partially defined by at least one substantially vertical wall extending from a first face coupled with a common electrode to a second face coupled with an associated sensor signal electrode.

4. The detector of claim 1, wherein the thermal sensitive elements are formed from pyroelectric material.

5. The detector of claim 1, wherein the thermal sensitive elements are formed from barium strontium titanate.

6. The detector of claim 1, wherein the infrared absorber and common electrode assembly comprises:
 a common electrode coupled with the thermal sensitive elements for supplying a voltage to the thermal sensitive elements; and
 an optical coating sensitive to infrared radiation disposed over the common electrode.

7. The detector of claim 1, wherein each thermal sensitive element is coupled on one side with a common electrode and on the other side with an associated sensor signal electrode, the sensor signal electrode further coupled through the thermal isolation structure with an associated signal contact pad disposed on the integrated circuit substrate.

8. A focal plane array including a plurality of thermal sensors for providing a sensor signal output representative of the amount of thermal radiation incident to the focal plane array, comprising:
 a common electrode for providing a voltage to the thermal sensors;
 an optical coating sensitive to incident infrared radiation coupled with one side of the common electrode;
 a plurality of thermal sensitive elements coupled with the opposite side of the common electrode, the thermal sensitive elements spatially separated by a plurality of reticulation kerfs, each reticulation kerf separating adjacent thermal sensitive elements by a distance at least half the average width of a single thermal sensitive element; and
 a plurality of sensor signal electrodes coupled with the thermal sensitive elements for receiving the sensor signal output representative of the amount of thermal radiation incident to the focal plane array.

9. The focal plane array of claim 8, wherein each thermal sensitive element is partially defined by at least one substantially vertical wall extending from a first face coupled with the common electrode to a second face coupled with an associated sensor signal electrode.

10. The focal plane array of claim 8, wherein the thermal sensitive elements are formed from pyroelectric material selected from the group consisting of barium strontium titanate, lead titanate, lead lanthanum titanate, lead zirconium titanate, and lead lanthanum zirconium titanate.

11. The focal plane array of claim 8, further comprising a thin, semi-transparent metal layer disposed over the optical coating.

\* \* \* \* \*